(12) United States Patent
Runaldue et al.

(10) Patent No.: US 6,178,483 B1
(45) Date of Patent: *Jan. 23, 2001

(54) METHOD AND APPARATUS FOR PREFETCHING DATA READ BY PCI HOST

(75) Inventors: Thomas J. Runaldue, San Jose; Denise Kerstein, Mountain View, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/993,045

(22) Filed: Dec. 18, 1997

Related U.S. Application Data

(60) Provisional application No. 60/038,025, filed on Feb. 14, 1997.

(51) Int. Cl.[7] .................................................. G06F 12/00
(52) U.S. Cl. ............................ 711/137; 711/154; 711/156
(58) Field of Search ................................. 710/128, 126, 710/129; 711/147, 137, 149, 154, 213, 202, 156

(56) References Cited

U.S. PATENT DOCUMENTS

| | | |
|---|---|---|
| 5,515,376 | 5/1996 | Murphy et al. . |
| 5,564,026 * | 10/1996 | Amini et al. ........................... 710/128 |
| 5,721,839 * | 2/1998 | Callison et al. ...................... 710/128 |
| 5,771,359 * | 6/1998 | Galloway et al. .................... 710/128 |
| 5,870,567 * | 2/1999 | Hausauer et al. ..................... 710/101 |
| 5,881,253 * | 3/1999 | Seeman ................................. 710/128 |

\* cited by examiner

Primary Examiner—John W. Cabeca
Assistant Examiner—Fred F. Tzeng

(57) ABSTRACT

Write posting buffers and read prefetch buffers are arranged in an integrated multiport switch between a PCI interface and an external memory interface. When a PCI host initiates a PCI transaction to write data from an external memory, the data provided by the PCI host is written into the write posting buffers. Then, the contents of the write posting buffers is transferred to the external memory. The read prefetch buffers are used to temporarily store data prefetched in anticipation of a PCI transaction initiated by the PCI host to read that data from the external memory. When the PCI host initiates the read transaction, the address of the requested data is compared with the address of the prefetched data to transfer the prefetched data to the host if a match is detected. In an auto-prefetch mode, data is automatically prefetched from the external memory when an extension bus port output queue contains a frame pointer for a frame queued for transmission over the PCI interface to the PCI host.

9 Claims, 7 Drawing Sheets

POSTING AND PREFETCH BUFFERS

WRITE POSTING BUFFER EXAMPLE

METHOD AND APPARATUS FOR PREFETCHING DATA READ BY PCI HOST

The present application claims the priority of provisional application No. 60/038,025, filed Feb. 14, 1997.

TECHNICAL FIELD

This invention relates to data processing systems and, more particularly, to a system for prefetching data read by a PCI host from an external memory.

BACKGROUND ART

The growth in computer applications that require heavy data traffic and the increasing availability of high-speed transmission lines create a need for a data switching system able to manage a huge amount of data at high rates. Such a data switching system controlled by a host processor has a large external memory for storing data. A peripheral component interconnect (PCI) bus may be employed to provide intercommunication between the host processor and the memory.

The address and data signals on the PCI bus are time multiplexed on the same 32 pins (AD0 through AD31). On the one clock cycle, the combined address/data lines carry the address values to move information between the PCI host and the memory. On the next cycle, the same lines switch to carrying the actual data.

To reduce latency when the PCI host reads data from the external memory, it would be desirable to provide a system for prefetching information expected to be read by the PCI host from the memory, prior to its actual reading by the host.

DISCLOSURE OF THE INVENTION

Accordingly, an advantage of the present invention is in providing a system for prefetching information expected to be read by a PCI host from an external memory, prior to its actual reading by the host.

The above and other advantages of the invention are achieved, at least in part, by providing a data communication system for supporting data exchange between communication ports that comprises a memory interface for interfacing the system with a memory, and a host interface for interfacing the system with a host. For example, a PCI interface may interface the system with a PCI host. Read prefetch buffers are arranged between the host interface and the memory interface for storing data prefetched from the memory in anticipation of a request from the host to read the data from the memory.

In accordance with one aspect of the invention, the data is automatically prefetched from the memory when a data pointer indicating that the data is queued for transmission to the host is detected at a predetermined communication port. For example, the predetermined communication port may support data transfer to an expansion bus coupled to the host interface for interconnecting multiple data communication switches.

The host interface may compare a read address provided by the host with the address of the prefetched data to transfer the prefetched data from the read prefetch buffer to the host if an address match is detected. If no address match is detected, data having the address provided by the host is prefetched from the memory into the read prefetch buffers.

In accordance with another aspect of the invention, the read prefetch buffers may be arranged in streams connected in parallel between the host interface and the memory interface. The number of streams is preprogrammed in accordance with the number of anticipated host accesses to non-sequential sections of the memory.

In accordance with a further aspect of the invention, write posting buffers are arranged between the host interface and the memory interface for temporarily storing data to be written by the host into the memory.

Still other objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVRNTION

Figure 1:
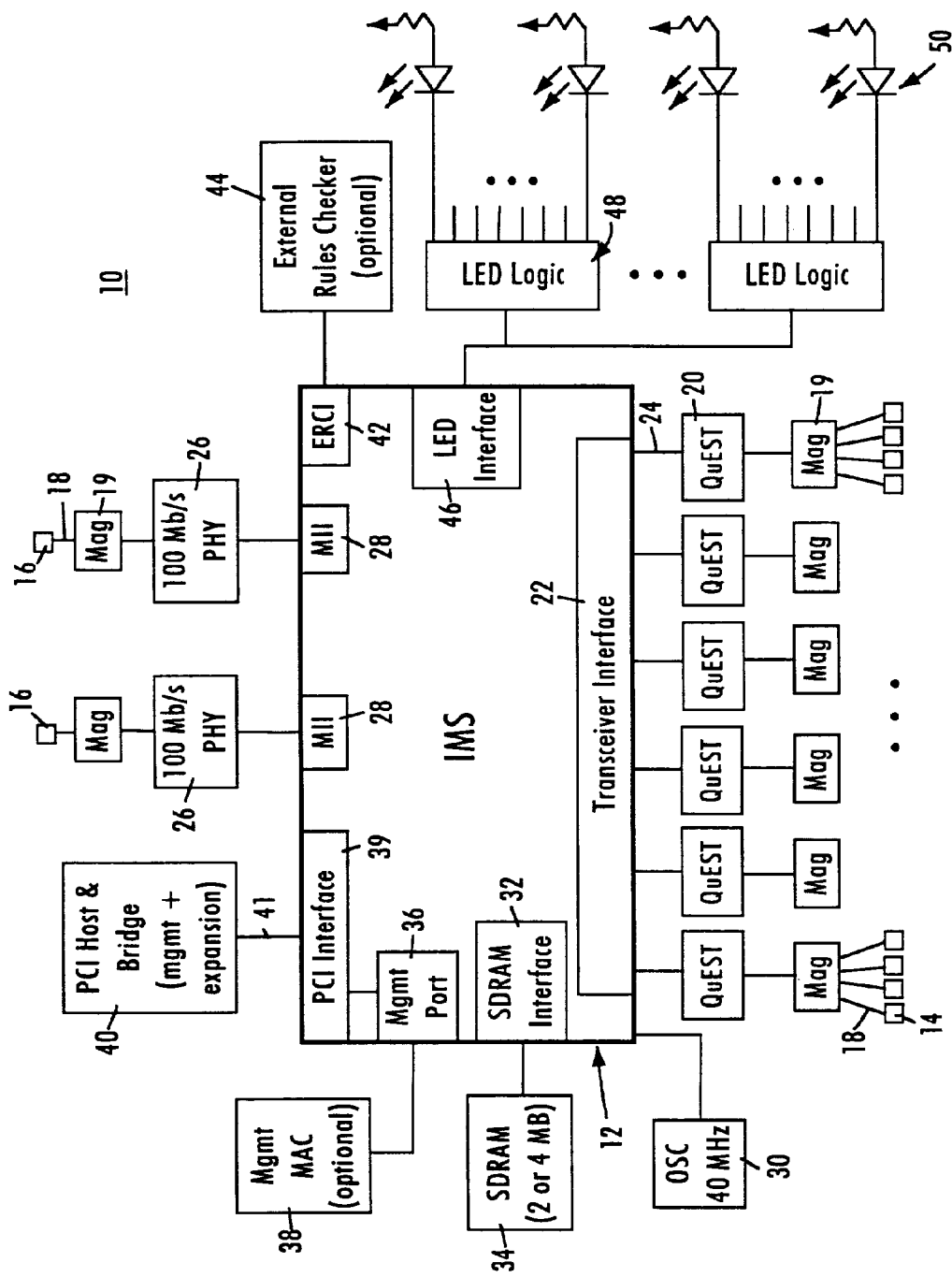
FIG. 1 is a block diagram of an exemplary system in which the present invention may be advantageously employed.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 via a management MAC interface 38. Also, the multiport switch 12 includes a PCI interface 39 connected to a host processor 40 via a PCI bus 41. The PCI interface 39 enables the PCI host processor 40 to access the internal IMS registers and the external memory 34. Alternatively, a PCI expansion bus may be attached to the PCI interface 39 to connect the switch 12 to other IMS devices.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figures 2, 2A:
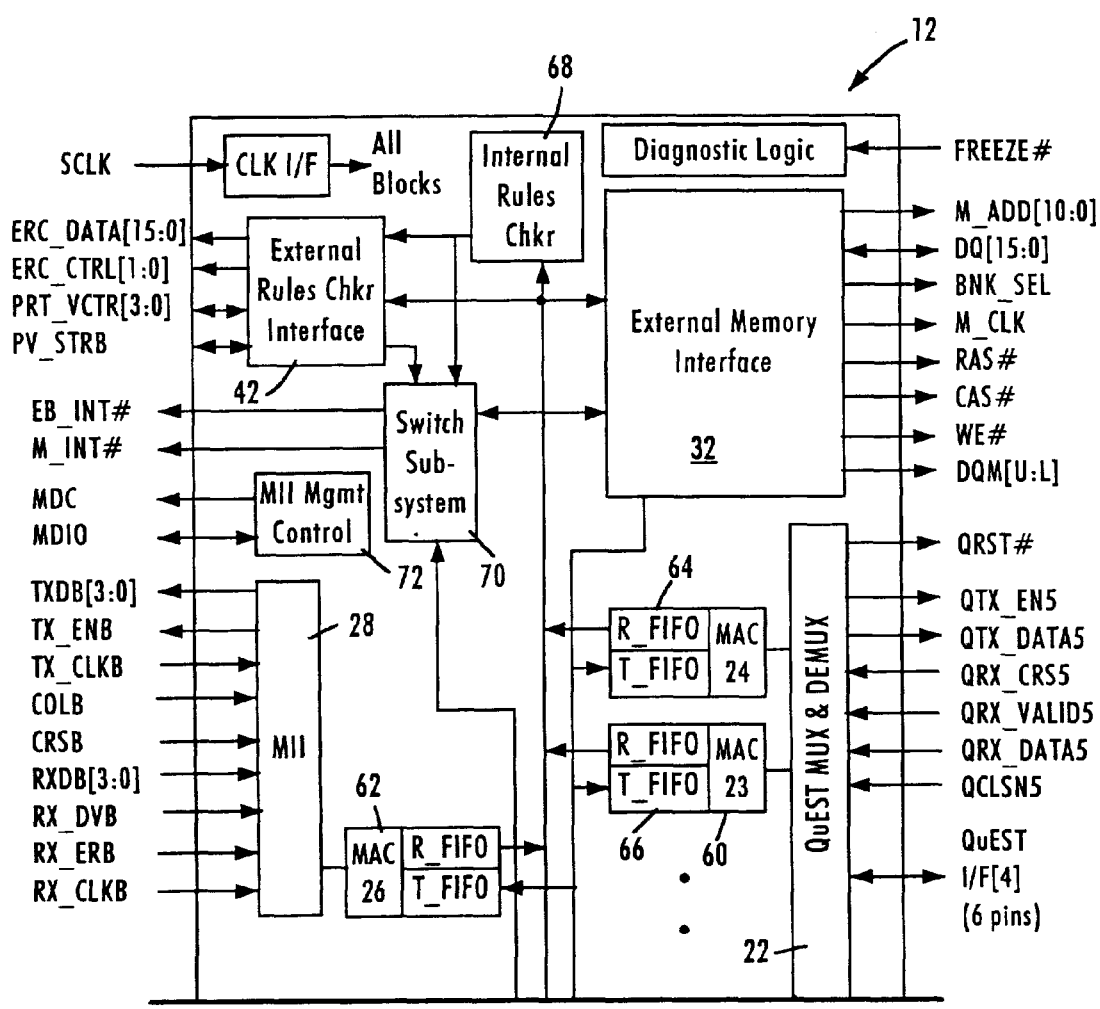
FIG. 2 is a block diagram of a multiport switch.
Figure 2B:
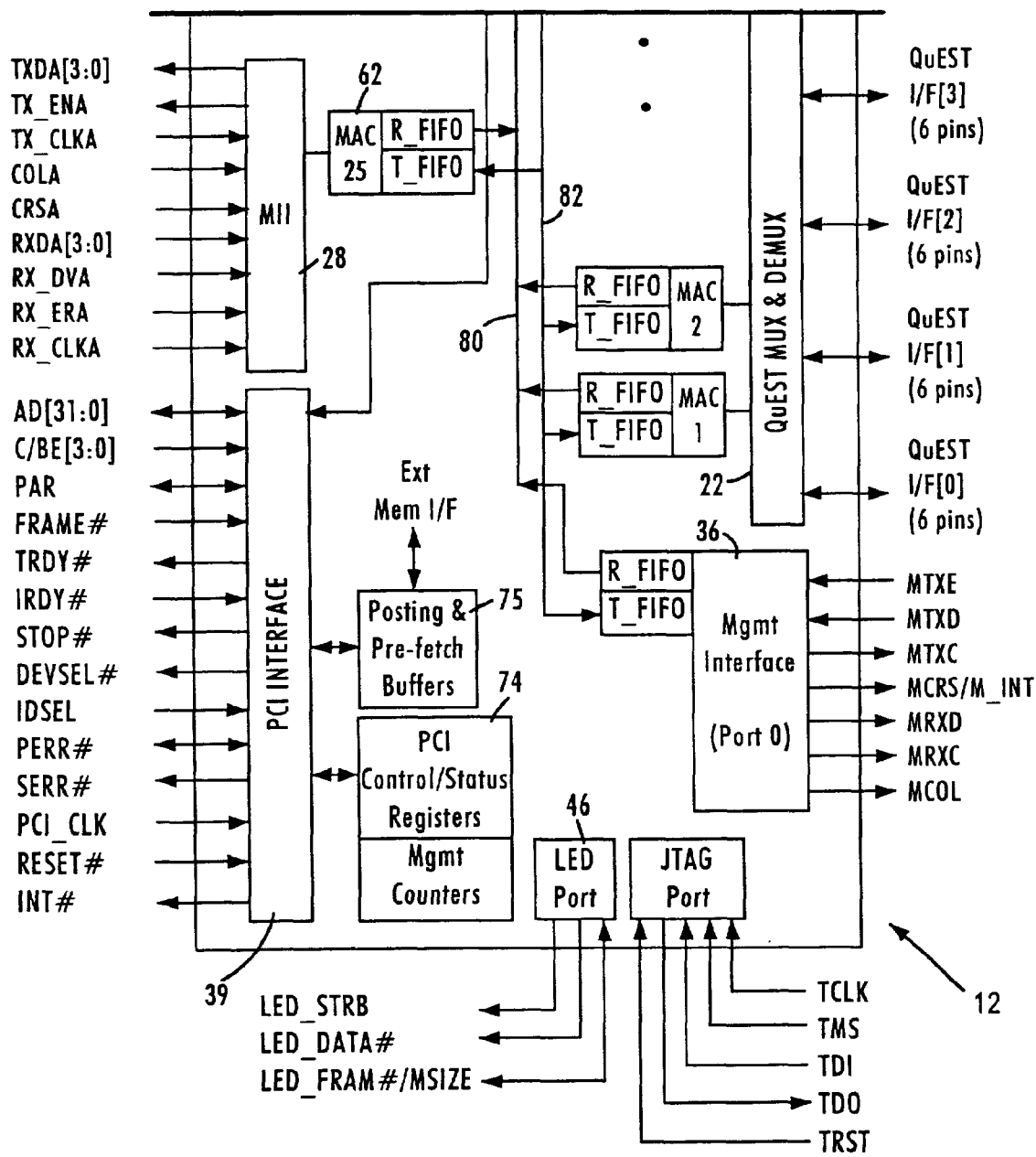

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 32, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data IO (MDIO) signal path.

The PCI interface 39 may be a 32-bit PCI revision 2.1 compliant slave interface for providing the PCI host processor 40 with access to internal IMS status and configuration registers 74, and to the external memory SDRAM 34. Write posting and read prefetch buffers 75 are arranged between the PCI interface 39 and the external memory interface to support host processor access to the external memory 34. The PCI interface 39 can also be coupled to an expansion bus for connecting multiple IMS devices with each other.

The management port 36 interfaces to an external MAC engine through a standard seven-wire inverted serial GPSI interface, enabling a host controller access to the multiport switch 12 via a standard MAC layer protocol.

Figure 3:
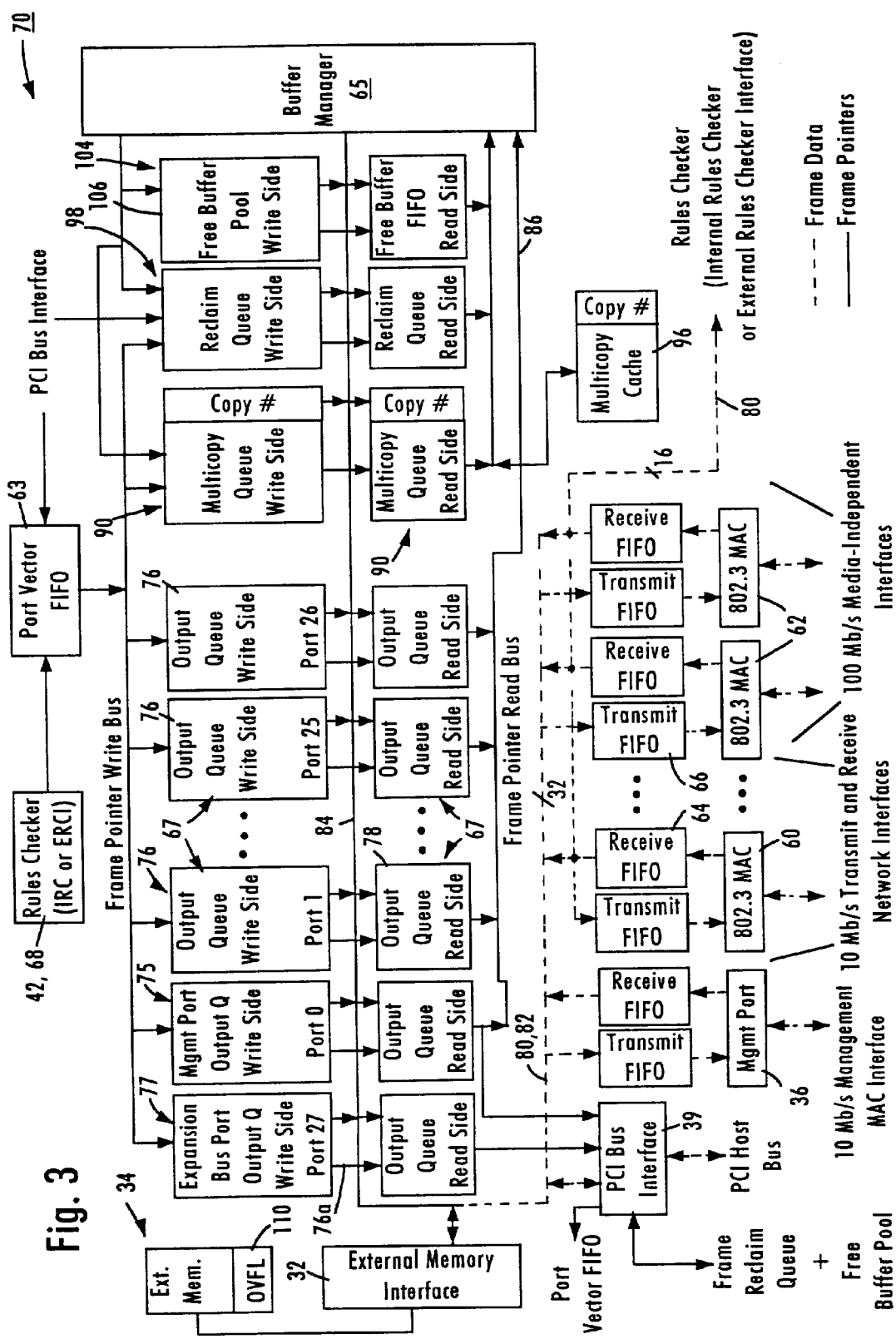
FIG. 3 depicts the switch subsystem of the multiport switch according to an exemplary embodiment of the present invention.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98. The operation and structure of these functional blocks will be described in more detail, but a brief overview of the switch subsystem 70 of FIG. 3 is first presented to provide context to the later discussion of the individual elements.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header is provided to a rules checker (i.e., either the internal rules checker 68 or the external rules checker interface 42). The rules checker, based on the information in the header, determines from where the frame packet will be cast, i.e., through which port or ports will the frame packet be transmitted.

At the same time as the rules checker 42 or 68 is making its forwarding determination, the buffer manager 65 obtains a free frame pointer from the free buffer pool 104. The free frame pointer specifies a location in external memory 36 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

The buffer manager 65 also sends the free frame pointer to the rules checker 42 or 68 to enable the appropriate rules checker to process the header information while maintaining the storage location of the data frame. This free buffer pointer is now referred to merely as a frame pointer, since it points to the memory location in the external memory 34 where the frame is stored. The rules checker 42 or 68 makes the forwarding decision, where the rules checker identifies at least one destination port for the data frame stored in the external memory 34 based on the corresponding header information, and generates a forwarding instruction in the form of a "port vector". In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 42 or 68. Hence, the rules checker uses the port vector to assign the frame pointer to at least one destination port.

The rules checker 42 or 68 places the port vector and the corresponding frame pointer (as well as a control opcode and a VLAN index) into the port vector FIFO 63. The port vector is examined by the port vector FIFO 63 to determine into which particular output queue 67 (or queues) the frame pointer associated with the port vector should be input. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer, and places the fetched data frame into the appropriate transmit FIFO 66 via a data bus 82 (see FIG. 2) for transmission by the corresponding MAC layer.

A multicopy transmission is similar to the unicopy transmission, except that the port vector has multiple bits set, designating the multiple destination ports from which the frame will be transmitted. The frame pointer is assigned (i.e., stored in) each of the appropriate output queues 67 and transmitted from the corresponding transmit FIFOs 54.

The buffer manager 65 uses the special control queues, e.g., the free buffer pool 104, the multicopy queue 90, the reclaim queue 98, and the multicopy cache 96 to manage the process of allocating buffers to store received data frames, and retrieving buffers for re-use once the frame has been transmitted to its designated output port(s). The buffer manager 65 also maintains "overflow" regions in external memory 36 for the output queues 67, 75, 77 and the control queues 104, 90 and 98. Specifically, these queues each include a three-part configuration including on-chip and off-chip storage locations. On-chip storage is preferable for high performance, where all of the queuing structure is maintained on the chip (referring to the multiport switch 12). However, the real estate on a chip is very expensive and real estate costs create a problem when the chip is designed to switch, and needs to queue, a large number of entries. The present invention solves this dilemma by providing a single output queue that includes a high performance, low capacity section that is on-chip, and an overflow area that is off-chip, i.e., is implemented on a separate discrete memory chip 34. The overflow area thus allows the queue to serve as a large capacity queue as needed, and is configured within the output queue in a manner that the a relatively lower performance of the off-chip overflow area does not adversely affect the overall performance of the output queue.

Each logical queue 67, 75, 77, 90, 98, and 104 of the present invention includes a write-side queue 76 and a read-side queue 78 located on the chip 12, and an output queue overflow area (generally designated as 110) located in an assigned portion of the external memory 34. Access to the external memory 34 for all of the output queues 67 is through the external memory interface 32, as described earlier. The present invention takes advantage of the bursting nature of current external memories, so that the overflow data (e.g., frame pointers) is sent on and off the chip to the overflow queue area 110 in bursts over the bus 84 to the external memory 34.

The write-side queue 76 and the read-side queue 78 located on the chip 12 are considered to be small, expensive, and high-performance resources. By contrast, the overflow area 110, forming the third part of the output queue 67, provides a large, inexpensive, low-performance, large capacity path.

Each buffer 67, 75, 77, 90, 98, and 104 operates by the corresponding write-side queue 76 receiving the corresponding frame pointer entry at an input end of the write-side queue 76. The frame pointer points to the first buffer location in external memory storing the first 256 bytes of a data frame.

After the entry flows through and reaches the output end at the bottom of the write-side queue 76, control logic associated with the output queue 67 selects whether the entry should be output to the corresponding assigned portion 110 of the external memory 34 or the read-side queue 78. If there is available space in the read-side queue 78 and the overflow area 110 for that output queue 67 is empty, then one or more entries are passed directly from the write-side queue 76 to the read-side queue 78. This passing of the entry or entries directly from the write-side queue 76 to the read-side queue 78 is performed entirely on the chip 12 and, thus, provides a low-latency, fast flow-through of an entry.

If the read-side queue 78 is full but there is not yet a burst-size amount of data in the write-side queue 76, then the entry remains in the write-side queue 76. If the read-side queue 78 is full and there is at least a burst-size amount of data (e.g., 16 bytes worth of entries) in the write-side queue 76, then the data is written in a burst fashion by the buffer manager 65 into the overflow area 110 in the corresponding assigned portion of the external memory 34. Eventually, the read-side queue 78 will empty, and, if there is data in the overflow area 110, the buffer manager 65 will supply a burst of data from the overflow area 110 into the read-side queue 78 when the read-side queue 78 has enough space to accommodate the burst-size amount of data. Hence, the read-side queue 78 selectively receives the frame pointer from the write-side queue 76 or the assigned portion 110 of the external memory 34.

Hence, if an output queue 67 begins to receive a large number of entries (e.g., frame pointers), these entries can be placed into the overflow area 110 to avoid overflowing the on-chip queue 78, minimizing possibility of discarding frames. The total amount of memory dedicated to the overflow areas 110 may also be readily changed by changing the size of the external memory 36. Furthermore, the sizes of the individual specific overflow areas 110 are programmable to customize the queue sizes without impacting the performance of the output queues 74.

The multiport switch as depicted in FIGS. 1 and 2 has twenty-eight output queues serving the twenty-four 10 Mb/s user ports 60, the two 100 Mb/s server ports 62, the management port 36 and the expansion bus port 38, respectively. The output queues 67, 75 and 77 provide temporary storage for frame pointers when they are queued for transmission. Queuing takes the form of the port vector FIFO 70 writing frame pointers into the various output queues 67, 75 and 77 indicated in a forwarding port vector.

Figure 4:
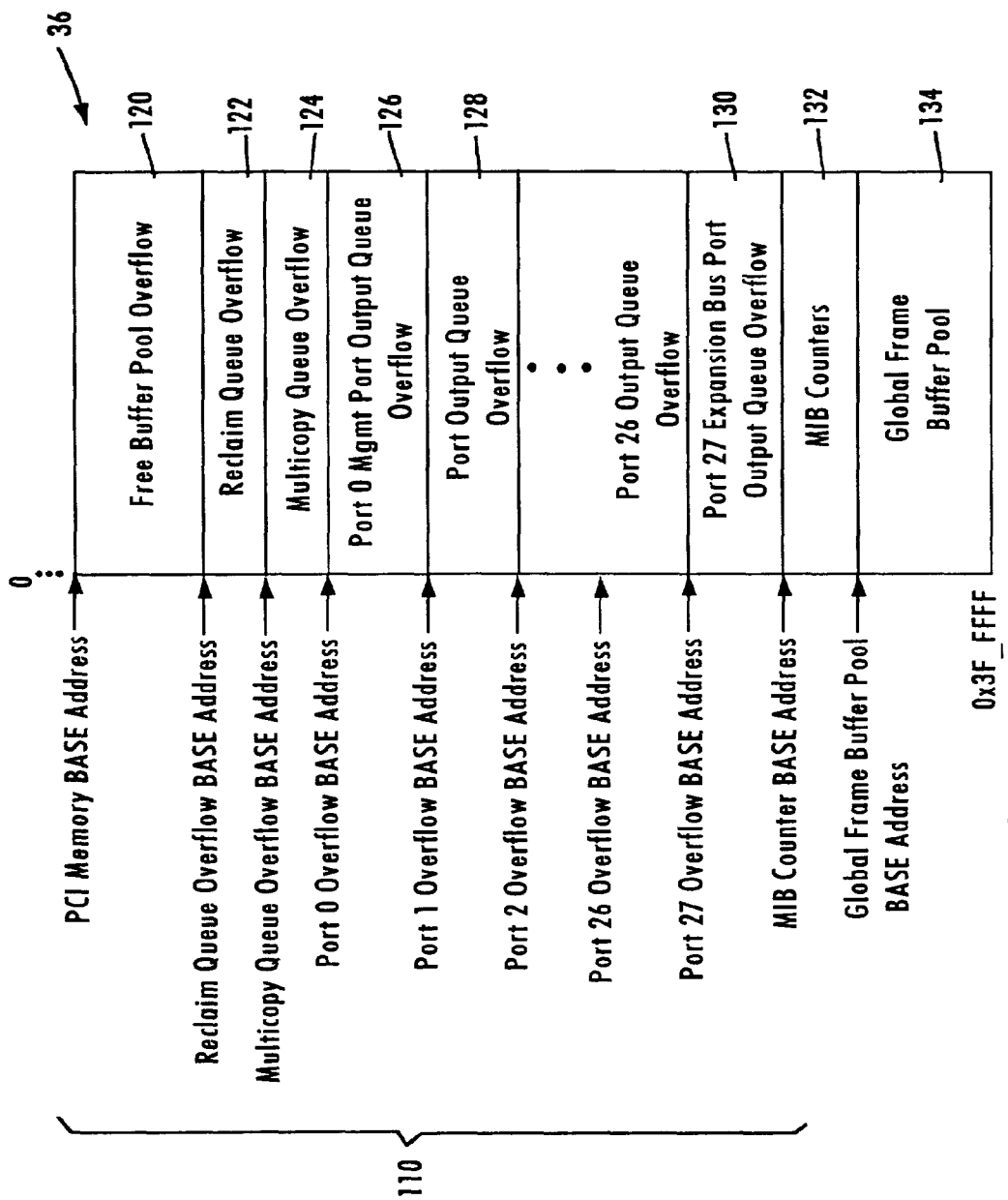
FIG. 4 is a diagram illustrating an exemplary map of an external memory in the multiport switch.

FIG. 4 is a diagram illustrating an exemplary map of the external memory 34. The overall capacity of the external memory 34 may be, for example, 4 Mb, although other capacity memories are employed in different embodiments. The use of an external memory 34 for the overflow areas according to the present invention permits increasing or decreasing the size of the output queues by simply changing the external memory. This is an advantage over systems in which the queue structure is entirely on the chip, as the overall queuing capacity is set at manufacture of the chip.

To satisfy the overflow storage requirements of the switch 12, the overflow region 110 of the external memory 34 has assigned memory portions for a free buffer pool overflow 120, a reclaim queue overflow 122, a multicopy queue overflow 124, a management port output queue overflow 126, output queue overflows 128 for each of the 10 Mb/s and 100 Mb/s destination ports (Ports 0–26), and an expansion bus port (Port 27) output queue overflow 130. The memory 34 also includes assigned portions for the MIB counters 132, and the global frame buffer pool 134.

The BASE Address for the entire memory region is programmable in a memory base address register among the registers 74 on the chip. The BASE Address for each area in the external memory map is programmable in the register set. No length register is required, since the length for a given area is equal to the area from that area's BASE Address to the BASE Address of the next adjacent area in the mapping.

Since the length (and therefore capacity) of each of the individual overflow areas is programmable, the overall capacity of each queue is programmable. This feature of the present invention permits customization of the switch to provide particular output queues with increased capacity, as needed.

The overflow areas 110 store excess entries that do not fit into the control queues on the chip 12. For example, the free buffer pool overflow area 120 stores for the free buffer pool 104 the excess free frame pointers identifying the currently unused buffers in the global frame buffer pool 134. The reclaim queue overflow area 122 stores for the reclaim queue 98 excess frame pointers to linked-list chains that are no longer needed. The multicopy queue overflow area 124 stores for the multicopy queue 90 excess frame pointers with copy numbers ">=1" (for queued frame pointers) and frame pointers with copy numbers "−1" (for successfully transmitted frames). The management port output queue overflow area 126 stores for the management port queue 74 excess assigned frame pointers awaiting transmission to the management port 36 (Port 0). Output queue overflow areas 128 store excess assigned frame pointers awaiting transmission to the appropriate 10 Mb/s ports (Ports 1–24) or 100 Mb/s ports (Ports 25–26) for the respective port queues 67. The expansion bus port output queue overflow area 130 for the expansion bus port (Port 27) queue 77 stores frame pointers awaiting transmission to the expansion bus port.

The MIB counter region 132 contains all the per port statistics which are updated periodically by the switch 12. The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 72 to the free buffer pool 104, or locations owned by the PCI host processor 40.

As discussed above, the multiport switch 12 comprises the PCI interface 39 which may be a 32-bit PCI revision 2.1 compliant interface arranged on the IMS chip to support communications with the host processor 40 via the PCI bus 41. The PCI expansion bus may be attached to the PCI interface 39 to connect the switch 12 to other IMS devices. The PCI interface 39 allows the PCI host, such as the processor 40 or a controller attached to the expansion bus, to read and write from and to the internal IMS status and configuration registers 74 and to read and write from and to the external memory SDRAM 34. During PCI data transfer operations, the PCI host acts as a master that controls the PCI bus 41 to send and receive signals to and from the slave PCI interface 39.

As shown in FIG. 2, the PCI interface 39 comprises 32 address/data bus interface pins AD[31:0]. PCI address and data signals are multiplexed on the same bus interface pins. For the first cycle of a transaction, AD[31:0] contain 32-bit address. During subsequent clocks of the transaction, the address/data bus interface pins contain data. For example, AD[31:24] may contain the most significant byte, whereas AD[7:0] may correspond to the least significant byte.

Bus command (C) and byte enable (BE) signals are multiplexed on four bus interface pins C/BE[3:0]#. During the address phase of a transaction, the C/BE[3:0]# pins define a 4-bit bus command C. During the data phase, the PCI interface 39 receives a 4-bit BE signal via the C/BE [3:0]#.

Other IMS pins that support PCI interface 39 are briefly described below. PAR pin provides an even parity signal for the signals on the AD[31:0] and C/BE[3:0] pins. FRAME# pin is driven by the PCI host at the beginning of the address phase to indicate that valid address and command respectively exist on the AD and C/BE# pins. TRDY# signal indicates the ability of the IMS 12 to complete the current data phase. IRDY# signal indicates the ability of the host to complete the current data phase. STOP# pin is driven by the IMS 12 to request the PCI host to stop the current bus transaction. DEVSEL# pin is driven by the IMS 12 to claim the access cycle for the current transaction after it decodes its address on the AD[31:0] pins. IDSEL pin contains a chip select signal for the IMS 12. PERR# signal is asserted by the IMS 12 if a parity error is detected during the write data phase. SERR# signal is asserted by the IMS 12 if a parity error is detected during the address phase. PCI_CLK signal is used for timing the PCI interface logic. RESET# signal causes the IMS 12 to perform internal system reset. INT# pin provides an interrupt signal.

The external memory interface 32 may be a 16-bit synchronous DRAM (SDRAM) interface that enables the IMS 12 and the PCI host to access the external SDRAM 34. An external memory interface clock (M_CLK) may be used to synchronize memory interface operations. The frequency of the M_CLK may be programmable. For example, the M_CLK frequency may be equal to 80, 100 or 120 MHz. The memory interface 32 provides an M_CLK line for supplying the M_CLK signal to the memory 34.

As shown in FIG. 2, the external memory interface 32 may further comprise an 11-bit address input bus M_ADD [10:0] for providing address inputs to the external memory 34. A 16-bit bi-directional data bus DQ[15:0] may be used for transferring data between the IMS 12 and the external memory 34. BNK_SEL signal may provide selection between two independent banks in the memory 34, when the host processor 40 accesses the memory 34. Row address strobe RAS#, column address strobe CAS#, and write enable signal WE# may define operation commands during data reading and writing operations. Data input/output mask line DQM[U:L] enables data output during a read cycle, and provides an input data mask during a write cycle.

Figure 5:
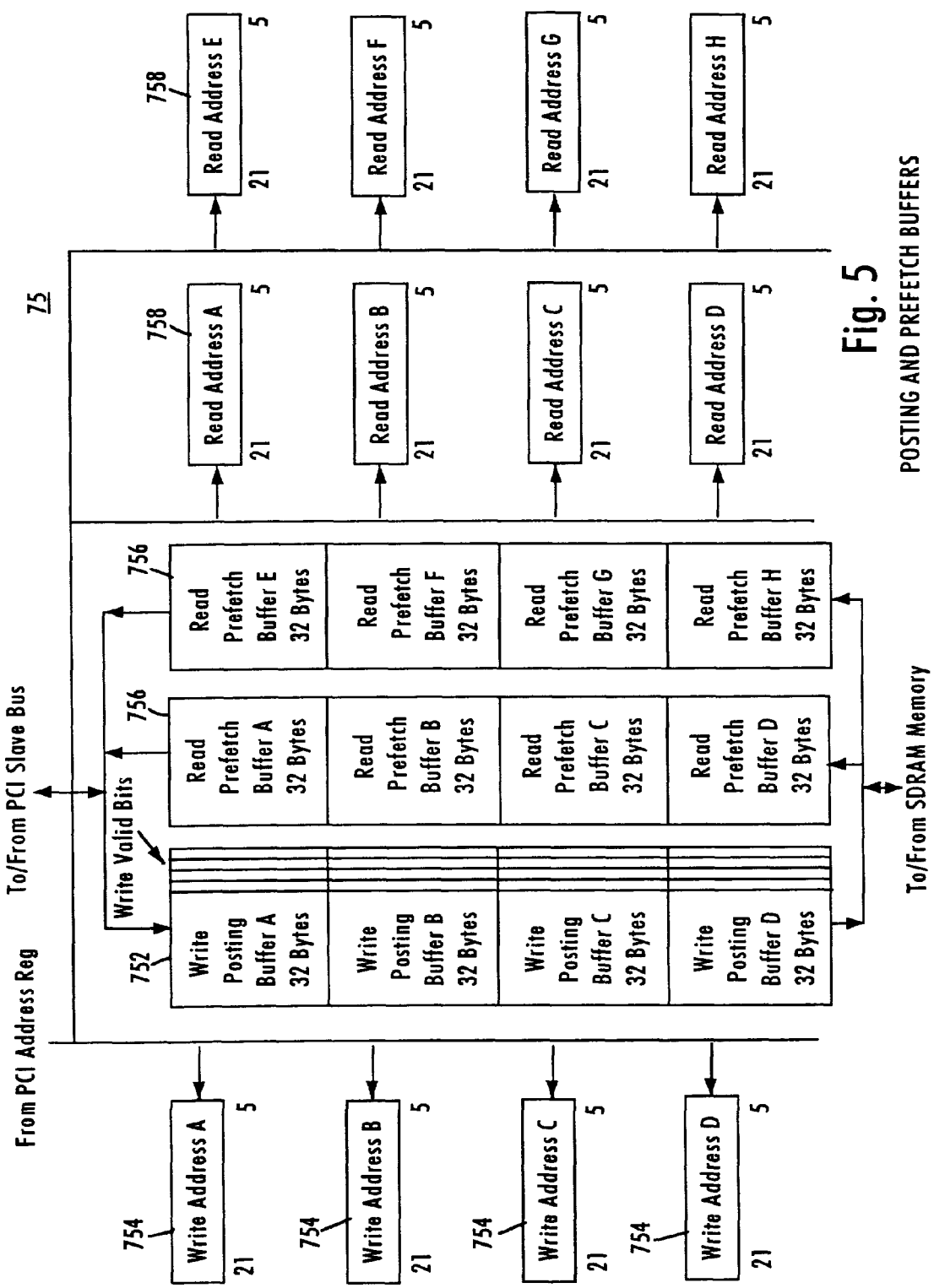
FIG. 5 is a diagram illustrating posting and prefetch buffer arrangement.

As discussed above, the posting and prefetch buffers 75 are arranged between the PCI interface 39 and the external memory interface 32 to support PCI host access to the external memory 34. Referring to FIG. 5, four 32-byte write posting buffers 752 may be available for temporarily storing data received from the PCI bus 41, before writing the data into the external SDRAM memory 34. For example, the write posting buffers may be arranged in one column coupled between the PCI bus 41 and the memory interface 32. Each write posting buffer 752 is provided with an internal write address holding register 754 for storing the posting buffer address transferred from the PCI host during the address phase of a PCI write operation. Write valid bits may be stored in each write posting buffer 752 to indicate which bytes in the buffer are valid.

Eight 32-byte read prefetch buffers 756 may be coupled between the PCI bus interface 39 and the external memory interface 32 to support PCI read operations. As described in more detail later, the read prefetch buffers 756 temporarily store data prefetched from the SDRAM 34 in anticipation of a request from the PCI host to read that data from the SDRAM 34. The read prefetch buffers 756 may be organized in a number of streams arranged in parallel between the PCI bus interface 39 and the external memory interface 32. For example, FIG. 5 shows two streams of buffers with four read prefetch buffers 756 in each stream. Alternatively, four buffer streams with two read prefetch buffers 756 in each stream may be coupled between the PCI bus interface 39 and the external memory interface 32. The number of the prefetch buffer streams may be preprogrammed according to the number of anticipated PCI host accesses to non-sequential regions of the SDRAM 34. Each prefetch read buffer 756 is provided with an internal read address register 758 that holds the address at which data of the prefetch read buffer 756 is stored in the SDRAM 34.

When a write operation is initiated to write data from the PCI bus 41 to the SDRAM 34, the PCI host writes the SDRAM address, at which the data is to be stored, into the write address register 754 and loads the data into the corresponding write posting buffer 752. Data from the PCI bus 41 may be accepted if any one of the write posting buffers 752 is in an idle state waiting for data to be posted.

Data is held in the write posting buffer 752 until the PCI host completes writing a burst of data or until the address of the data to be written indicates that the burst exceeds the 32-byte boundary of the write posting buffer 752. When either of these conditions occurs, the write posting buffer 752 is locked and waits to transfer its contents to the external memory 34. The data transfer to the external memory 34 is provided via the external memory interface 32 using the corresponding combination of operation commands RAS#, CAS# and WE#.

If a burst of data to be written exceeds the 32-byte boundary of the write posting buffer 752, the next posting buffer 752 is checked to determine whether it is available for accepting the data. If any posting buffer is free, the PCI host writes the remaining data of the burst into the free buffer 752. If all write posting buffers 752 are locked, the PCI burst is terminated, and a disconnect signal is sent to the PCI host. Each burst of data to be stored in non-sequential locations of the external memory 32 is written into a different write posting buffer 752, unless the memory locations fall within the same 32-byte memory region.

Figure 6:
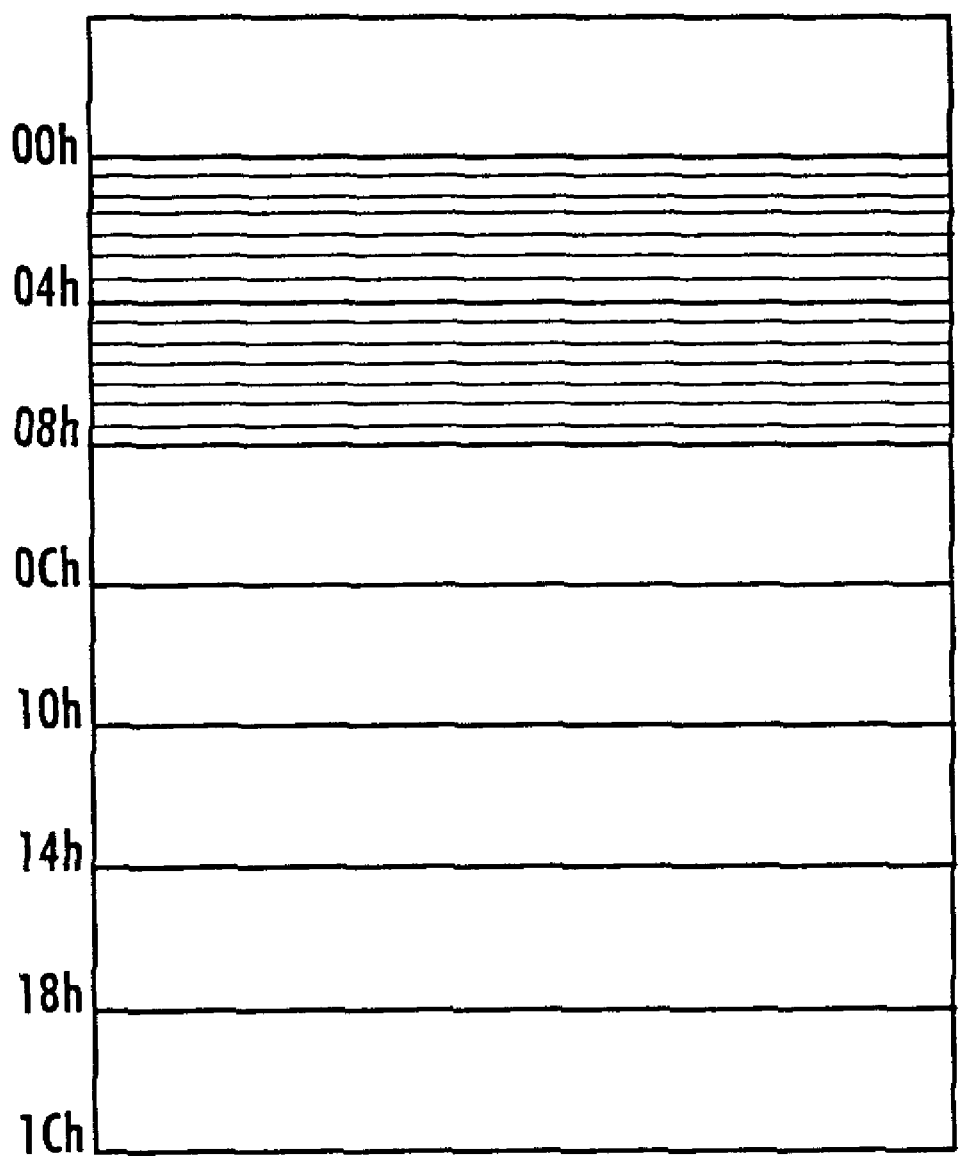
FIG. 6 is a diagram illustrating writing into the posting buffer.

The PCI host may write data to specific locations of a write posting buffer 752 beginning from an address offset provided by the host. For example, as illustrated in FIG. 6, if the PCI host desires to write two words beginning with address offset O4h, the data is written into the second and third locations of the write posting buffer 752.

As discussed above, the read prefetch buffers 756 temporarily store data prefetched from the external memory 34, before the PCI host initiates a PCI transaction to read that data. The read prefetch buffers 756 may support PCI operations performed to read various SDRAM data, such as MIB data, management port data, expansion bus port data, or routing data from ports 1–26 stored in the corresponding sections of the SDRAM 34.

When the PCI host performs a PCI transaction to read data from the SDRAM 34, address data provided by the host during the address phase of the PCI transaction is compared with address data held in the read address registers 758. If an address match is detected for one of the read prefetch buffers 756, a 32-byte block of data stored in that read prefetch buffer 756 is transferred via the PCI interface 39 to the PCI host.

If no address match is detected, the IMS performs a PCI retry operation to inform the PCI host that requested data is not available. Simultaneously, based on the address provided by the PCI host, the requested data is prefetched from the SDRAM 34 via the external memory interface 32 into one of the read prefetch buffer streams.

The address of the requested data is written into the read address register 758 in the read prefetch buffer 756 that stores the prefetched data. When the PCI host repeats its PCI transaction to read the previously requested data, the prefetched data is immediately transferred from the read prefetch buffers 756 to the PCI host.

When any data source within the IMS writes data into the SDRAM location having address that matches the address currently held in the read address registers 758, data prefetched from that SDRAM location is marked as invalid to prevent the prefetched data from being transferred to the PCI host.

The IMS may establish a priority for reading by the PCI host various types of data stored in the SDRAM 34. For example, the highest priority may be assigned to reading data from the memory portion 130 for the expansion bus port 27 which supports the expansion bus for interconnecting multiple IMS devices.

In order to reduce latency when the host reads expansion bus port data from the SDRAM 34, the IMS may perform auto-prefetching of the expansion bus port data from the SDRAM 34 to the read prefetch buffers 756. When the expansion bus port output queue 77 contains a frame pointer for a frame queued for transmission over the PCI interface 39 to the PCI host, an expansion bus interrupt signal EB_INT# may be produced by the PCI interface 39 to notify the PCI host that the expansion bus data is available. When the EB_INT# signal is asserted, the IMS automatically prefetches from the SDRAM 34 data of the frame indicated by the frame pointer in the expansion bus port output queue 77.

If a single frame pointer resides in the expansion bus port output queue 77, the IMS prefetches data for that frame pointer into a single stream of the read prefetch buffers 756. The amount of data that can be prefetched is determined by the free space available in the read prefetch buffers 756 of that stream. If the expansion bus port output queue 77 contains more than one frame pointer, the IMS prefetches data for as many frame pointers as there are streams of read prefetch buffers available.

After the host reads a frame pointer from the expansion bus port output queue 77, it accesses a single read prefetch buffer 756 to read the prefetched 32-byte data block of the frame indicated by the frame pointer. Thereafter, the IMS automatically prefetches the next data block of that frame from the SDRAM 32. After the host reads the prefetched data block, another data block of the same frame is prefetched from the SDRAM 34. This procedure continues until the last data block of the frame is prefetched and read by the host. Then, the IMS prefetches the buffer stream with data for the next frame pointer in the expansion bus port output queue 77.

Between two sequential PCT accesses to read extension bus port data, the host may perform a PCT access to read another type of data, such as MIB data, management port data or routing data. Any available read prefetch buffer stream is used for the new read operation.

If all buffer streams contain prefetched data, the IMS may overwrite one of the streams with the data required for the new read operation. For example, if at least one of the streams contains prefetched data for a frame pointer which has not been read by the host from the expansion bus port output queue 77, the IMS selects the stream with the data indicated by the last unread frame pointer and overwrites that stream with the new data prefetched from the SDRAM 34 for reading by the host. Later, the IMS repeats prefetching the overwritten data.

If all streams contain data prefetched during retry operations after previous read attempts, or prefetched expansion bus port data of a frame currently read by the host, the IMS selects the stream with the oldest data and overwrites that stream with the new prefetched data. It is noted that if the host has already read the frame pointer from the expansion bus port output queue 77 for the data contained in the overwritten stream, the IMS will not be able to prefetch the overwritten data again. Instead, the data will be recovered when the host initiates a PCI transaction to read the remainder of the frame indicated by that frame pointer.

There accordingly has been described write posting buffers and read prefetch buffers arranged in an integrated multiport switch between a PCI interface and an external memory interface. When a PCI host initiates a PCI transaction to write data from an external memory, the data provided by the PCI host is written into the write posting buffers. Then, the contents of the write posting buffers is transferred to the external memory. The read prefetch buffers are used to temporarily store data prefetched in anticipation of a PCI transaction initiated by the PCI host to read that data from the external memory. When the PCI host initiates the read transaction, the address of the requested data is compared with the address of the prefetched data to transfer the prefetched data to the host if a match is detected. In an auto-prefetch mode, data is automatically prefetched from the external memory when an extension bus port output queue contains a frame pointer for a frame queued for transmission over the PCI interface to the PCI host.

What is claimed is:

1. A data communication system provided with a memory and controlled by a host for supporting data exchange between communication ports, comprising:
   a memory interface for interfacing said system with said memory,
   a host interface for interfacing said system with said host, and
   read prefetch buffers arranged between said host interface and said memory interface for storing data prefetched from said memory in anticipation of a request from said host to read said data from said memory,
   wherein said read prefetch buffers are arranged in a number of streams connected in parallel between said host interface and said memory interface, the number of said streams is preprogrammed in accordance with the number of anticipated host accesses to non-sequential sections of said memory.

2. The system of claim 1, wherein said read prefetch buffers are arranged to receive data automatically prefetched from said memory when a data pointer for said data is detected at a predetermined communication port.

3. The system of claim 2, wherein said predetermined communication port is arranged to support data transfer to an expansion bus coupled to said host interface.

4. The system of claim 1, wherein said host interface is arranged to compare a read address indicated by said host with an address of the prefetched data in said read prefetch buffers, to transfer the prefetched data to said host if an address match is detected.

5. The system of claim 4, wherein said read prefetch buffers are arranged to receive new data prefetched from a location of said memory having said read address, if no address match is detected.

6. The system of claim 1 further comprising write posting buffers arranged between said host interface and said memory interface for receiving data to be written by said host in said memory.

7. The system of claim 1, wherein said host interface comprises a PCI interface.

8. A system for reading data from a memory to a PCI host, comprising:
   a PCI interface for providing an interface with said PCI host in accordance with PCI requirements,
   a memory interface for providing an interface with said memory,
   a read prefetch buffer coupled between said PCI interface and said memory interface for storing information expected to be read by said PCI host from said memory, and
   a read address register for holding an address of a memory location in which the data prefetched into said read prefetch buffer is stored in said memory
   wherein said read prefetch buffer comprises multiple buffer sections arranged in a number of streams connected in parallel between said PCI interface and said memory interface, the number of said streams is preprogrammed in accordance with the number of anticipated PCI host accesses to non-sequential sections of said memory.

9. A method of reading data from a memory by a host in a data communication system having multiple communication ports, comprising the steps of:
   storing data for said communication ports in said memory,
   monitoring said communication ports to detect a frame pointer for a frame queued for transmission to the host,
   automatically prefetching data for a predetermined communication port from said memory to a prefetch buffer when said frame pointer is detected at said predetermined communication port, and
   transferring said prefetched data from said prefetch buffer to said host when said host initiates a read operation to read said data from said memory,
   wherein said read prefetch buffer comprises multiple buffer sections arranged in a number of streams connected in parallel, the number of said streams is preprogrammed in accordance with the number of anticipated host accesses to non-sequential sections of said memory.

* * * * *